United States Patent
Nam et al.

(10) Patent No.: US 7,227,790 B2
(45) Date of Patent: Jun. 5, 2007

(54) NOR FLASH MEMORY DEVICE WITH A SERIAL SENSING OPERATION AND METHOD OF SENSING DATA BITS IN A NOR FLASH MEMORY DEVICE

(75) Inventors: Sang-Wan Nam, Yongin-si (KR); Young-Ho Lim, Yongin-si (KR); Dae-Han Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/263,716

(22) Filed: Nov. 1, 2005

(65) Prior Publication Data
US 2006/0215449 A1  Sep. 28, 2006

(30) Foreign Application Priority Data
Mar. 22, 2005  (KR) ............... 10-2005-0023751

(51) Int. Cl.
*G11C 7/06* (2006.01)
(52) U.S. Cl. .................. 365/189.07; 365/221
(58) Field of Classification Search .......... 365/189.07, 365/221
See application file for complete search history.

(56) References Cited

U.S. PATENT DOCUMENTS 5,973,957 A * 10/1999 Tedrow ................. 365/185.03
6,363,010 B2 * 3/2002 Tanaka et al. ......... 365/185.03
2003/0214867 A1 * 11/2003 Goldman et al. ........... 365/207

FOREIGN PATENT DOCUMENTS

| JP | 2000-232352 | 8/2000 |
| KR | 2001-0029079 | 4/2001 |
| KR | 10-2004-0051911 | 6/2004 |

* cited by examiner

*Primary Examiner*—Huan Hoang
*Assistant Examiner*—Kretelia Graham
(74) *Attorney, Agent, or Firm*—Mills & Onello LLP

(57) ABSTRACT

In a NOR flash memory device with a serial sensing operation, and method of sensing data bits in a NOR flash memory device, the device includes a multilevel cell, a sense amplifying circuit, a data buffer, a data latch circuit, and a control logic circuit. The sense amplifying circuit serially detects plural data bits stored in the multilevel cell. The data buffer is provided to buffer the data bit detected by the sense amplifier. The data latch circuit stores an output value of the data buffer for a time. The control logic circuit regulates the sense amplifying circuit to detect a lower data bit stored in the multilevel cell in response to a higher data bit held in the data latch. Here, the control logic circuit initializes an output terminal of the data buffer before or while sensing each of the plural data bits by the sense amplifier. According to the invention, a stabilized serial sensing operation can be conducted because the data line is conditioned to a uniform charge level regardless of the level of the data bit previously sensed.

5 Claims, 4 Drawing Sheets

NOR FLASH MEMORY DEVICE WITH A SERIAL SENSING OPERATION AND METHOD OF SENSING DATA BITS IN A NOR FLASH MEMORY DEVICE

CROSS-REFERENCE TO RELATED APPLICATIONS

This U.S. non-provisional patent application claims priority under 35 U.S.C. § 119 to Korean patent application 2005-23751 filed on Mar. 22, 2005, the entire contents of which are hereby incorporated by reference.

BACKGROUND OF THE INVENTION

The present invention is concerned with semiconductor memory devices, and, in particular, relates to a NOR flash memory device and method of serially sensing a data bit.

Semiconductor memory devices are data storage apparatuses capable of storing and retrieving. Such devices can be classified generally as random access memories (RAMs) and read only memories (ROMs). The RAM devices are volatile memory devices that lose their data when the power supply is cut off or interrupted, while the ROM devices are nonvolatile memory devices that are configured to retain their data even without power supply. The RAM devices include dynamic RAMs (DRAMs), static RAMs (SRAMs), and so forth, while the ROMs include programmable ROMs (PROMs), erasable PROMs (EPROMs), electrically EPROMs (EEPROMs), flash memories, and so forth.

Flash memory devices are attractive because they consume relatively low power and are flexible and efficient in inputting and outputting information. For these reasons, they are especially applicable to be employed in portable apparatuses such as digital cameras, mobile phones, PDAs, and the like. Flash memory devices can be generally categorized into NAND and NOR types in accordance with the structural feature of the memory cell array. The NAND flash memory devices are relatively simple in structure, so they are advantageous in enlarging the device storage capacity and cheaper than the NOR type devices. The NAND flash memory devices are commonly utilized as data storage components for USB storage apparatuses or MP3 players. Otherwise, the NOR flash memory devices are operable in high speed devices as code storage components, being usually embedded in mobile telephone terminals that require high-rate operation.

A memory cell of the NOR flash memory device is formed by having source and drain regions doped with N+ impurities, between which a channel region is interposed in a P-type semiconductor substrate. The memory cell also includes a floating gate formed by interposing a thin insulation film under 100 Å on the channel region, and a control gate formed by interposing an insulation film on the floating gate. The source, the drain, the control gate, and the substrate, of the memory cell, are connected to bias voltages during programming, erasing, or reading operations.

For instance, in a reading operation, a selected memory cell to be read out is supplied with about 1V to the drain region, 4.5V to the control gate, 0V to the source region, and 0V to the substrate. When the reading operation is carried out in the bias condition, a programmed cell does not flow a current from the drain region to the source region, and an erased cell flows a current from the drain region to the source region through the channel. Here, the programmed cell is referred to as 'OFF-cell', while the erased cell is referred to as 'ON-cell'.

On the other hand, it is preferred that the NOR flash memory device have a larger storage capacity in a smaller area. In implementing the small-area large-capacity NOR flash memory device, it is necessary to enhance the integration density, but there are inherent limits to making the integration density higher under present semiconductor processing technology. Thus, studies for methodologies to overcome the limit on processing technology have been conducted to increase the storage capacity even without raising the integration density. One of the methods is storing multiple bits of data in a single memory cell. A memory cell storing multiple data bits is referred to as a multilevel cell (MLC). For example, a memory cell storing 2-bit data contains 4 state levels such as '11', '10', '01', and '00'. The 4 state levels are differentiated by differences in the levels of current that flow through the memory cell during a reading operation.

In order to sense or detect multiple data bits stored in the multilevel cell, a sense amplifier and a data buffer are used, as well known in this art. The sense amplifier finds multiple data bits stored in the multilevel cell by detecting and amplifying a difference between a reference current amount and a current amount flowing through the multilevel cell. The data buffer buffers data detected and output from the sense amplifier. The buffered data is stored in a data latch through a data line.

In general, a NOR flash memory device uses serial and parallel sensing techniques in order to detect multiple data bits stored in a multilevel cell. The serial sensing technique is a way of detecting multiple data bits in sequence by means of a single amplifier, while the parallel sensing scheme is a way of detecting multiple data bits at a time by means of plural amplifiers. As the parallel sensing scheme employs a multiplicity of sense amplifiers, sensing speed is faster but a sensing margin is degraded due to mismatches between different sense amplifiers.

Otherwise, the serial sensing scheme is more advantageous than the parallel sensing scheme in overcoming the problem of mismatches because it uses a single sense amplifier. However, as the serial sensing scheme detects multiple data bits in sequence by means of a single amplifier, a data line may be influenced by a data bit generated from the previous sensing step. Further, the condition of the data line frequently changes from a high level to a low level or from a low level to a high level, resulting in a decrease of sensing margin in accordance with variation of state levels.

SUMMARY OF THE INVENTION

The present invention addresses the aforementioned limitations, providing a NOR flash memory device operable with a data line conditioned in a uniform level without being affected by the state of the previous data bit by initializing the data line whenever sensing each of multiple data bits.

In one aspect, the present invention is directed to a NOR flash memory device comprising a multilevel cell, a sense amplifying circuit, a data buffer, a data latch circuit, and a control logic circuit. The sense amplifying circuit serially detects the multiple data bits stored in the multilevel cell. The data buffer buffers a data bit detected by the sense amplifying circuit. The data latch circuit holds an output value of the data buffer. The control logic circuit regulates the sense amplifying circuit to detect a lower data bit stored in the multilevel cell in response to a higher data bit held in the data latch circuit. The control logic circuit initializes an output terminal of the data buffer before detecting each of the multiple data bits by the sense amplifying circuit.

In one embodiment, the control logic circuit provides a buffer enabling signal to the data buffer to buffer the data bit detected by the sense amplifying circuit. The data buffer comprises: a tri-state buffer sequentially buffering each of the multiple data bits detected by the sense amplifying circuit, in response to the buffer enabling signal; and an initializing circuit initializing an output node of the tri-state buffer before detecting each of the multiple data bits by the sense amplifying circuit, in response to a reset signal provided by the control logic circuit. The tri-state buffer is an inverter operating in response to the buffer enabling signal and the initializing circuit is a MOS transistor forming a current channel between the output node of the tri-state buffer and a ground voltage terminal in response to the reset signal.

In another aspect, the present invention is directed to a NOR flash memory device comprising a multilevel cell, a sense amplifying circuit, a data buffer, a data latch circuit, and a control logic circuit. The sense amplifying circuit serially detects the multiple data bits stored in the multilevel cell. The data buffer buffers a data bit detected by the sense amplifying circuit. The data latch circuit stores an output value of the data buffer. The control logic circuit regulates the sense amplifying circuit to detect a lower data bit stored in the multilevel cell in response to a higher data bit held in the data latch circuit. The control logic circuit initializes an output terminal of the data buffer while detecting each of the multiple data bits by the sense amplifying circuit.

In one embodiment, the control logic circuit initializes the output terminal of the data buffer when the sense amplifying circuit begins detecting each of the multiple data bits.

In another embodiment, the control logic circuit provides a buffer enabling signal to the data buffer to buffer the data bit detected by the sense amplifying circuit. The data buffer comprises: a tri-state buffer sequentially buffering each of the multiple data bits detected by the sense amplifying circuit, in response to the buffer enabling signal; and an initializing circuit initializing an output node of the tri-state buffer while detecting each of the multiple data bits by the sense amplifying circuit, in response to a reset signal provided by the control logic circuit. The tri-state buffer is an inverter operating in response to the buffer enabling signal and the initializing circuit is a MOS transistor forming a current channel between the output node of the tri-state buffer and a ground voltage terminal in response to the reset signal.

In another aspect, the present invention is directed to a method of sequentially sensing multiple data bits stored in a multilevel cell of a NOR flash memory device comprising the steps of: initializing a data line and sensing a higher data bit; loading the sensed higher data bit on the data line and latching the loaded higher data bit; initializing the data line and sensing a lower data bit in response to the latched higher data bit; and loading the sensed lower data bit on the data line and latching the loaded lower data bit.

In one embodiment of the method, the data line is initialized before sensing the higher data bit and also initialized before sensing the lower data bit.

In another embodiment of the method, the data line is initialized while sensing the higher data bit and also initialized while sensing the lower data bit, for example when beginning to sense the higher data bit and when beginning to sense the lower data bit.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention. In the drawings.

DETAILED DESCRIPTION OF EMBODIMENTS OF THE INVENTION

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete. Like numerals refer to like elements throughout the specification.

Figure 1:
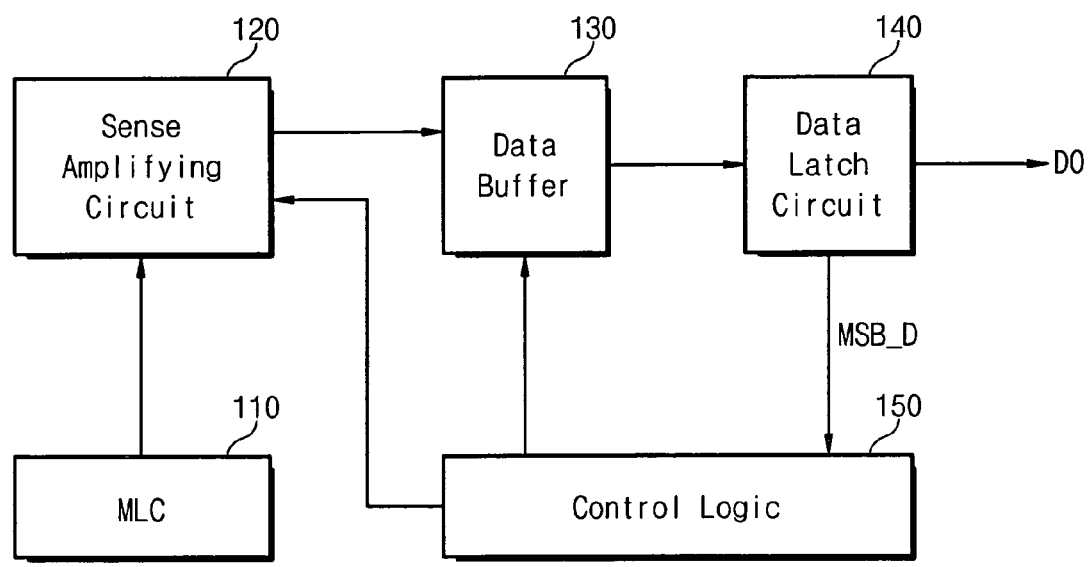
FIG. 1 is a block diagram illustrating a NOR flash memory device according to a preferred embodiment of the present invention.

FIG. 1 is a block diagram illustrating a NOR flash memory device according to a preferred embodiment of the present invention. Referring to FIG. 1, the NOR flash memory device 100 is comprised of a multilevel cell (MLC) 110, a sense amplifying circuit 120, a data buffer 130, a data latch circuit 140, and a control logic circuit 150. The NOR flash memory device 100 sequentially reads out multiple data bits stored in the multilevel cell 110.

The multilevel cell 110 stores multiple data bits. As an example, assuming that the multilevel cell 110 stores 2-bit data of '10', '1' is a higher data bit and '0' is a lower data bit. Here, the higher data bit is a relative meaning as being detected earlier than the lower data bit. In other words, in 3-bit data of 'abc', 'a' is a higher data bit sensed earlier than 'b' while 'b' is a higher data bit sensed earlier than 'c'.

The sense amplifying circuit performs a serial sensing operation. The serial sensing operation operates to sense a lower data bit after reading out a higher data bit by means of a single sense amplifier. The data buffer 130 buffers a data bit detected by the sense amplifying circuit 120. The data latch circuit 140 is connected to the data buffer 130 through a data line dl, latching an output value of the data buffer 130.

The control logic circuit 150 regulates the sense amplifying circuit 120 to detect a higher data bit stored in the multilevel cell 110. The sense amplifying circuit 120 detects the higher data bit under control by the control logic circuit 150. During this operation, the control logic circuit 150 initializes an output terminal (or a data line DL) of the data buffer 130 before detecting, or while detecting, the higher data bit by the sense amplifying circuit 120. The data buffer 130 buffers the higher data bit detected by the sense amplifying circuit 120 after completing the initialization for the output terminal of the data buffer 130. The data latch circuit 140 holds the higher data bit buffered by the data buffer 130.

Next, the control logic circuit 150 regulates the sense amplifying circuit 120 to detect a higher data bit stored in the multilevel cell 110 in response to the higher data bit MSB_D held in the data latch circuit 140. The sense amplifying circuit 120 detects a lower data bit under the control of the control logic circuit 150. During this, the control logic circuit 150 initializes the output terminal of the data buffer 130 before detecting, or while detecting, the lower data bit by the sense amplifying circuit 120. The data buffer 130 buffers the lower data bit detected by the sense amplifying circuit 120 after completing the initialization for the output terminal of the data buffer 130. And then, the data latch circuit 140 holds the lower data bit buffered by the data buffer 130.

The NOR flash memory device 100 outputs multiple data bits, which are temporarily stored in the data latch circuit 140, to the external system through a data output circuit (not shown).

The NOR flash memory device 100 according to the present invention initializes an output terminal of the data buffer 130 before, or while, the sense amplifying circuit 120 detects each of the multiple data bits stored in the multilevel cell 110. Thus, it is possible to conduct a stabilized serial sensing operation in a uniform level regardless of the previous state of the data line DL. Further, as the serial sensing operation in the NOR flash memory device according to the present invention is able to normally conduct sensing operations with a level uniformity, it is possible to assure a larger sensing margin than the conventional approach and to enhance sensing speed.

Figure 2:
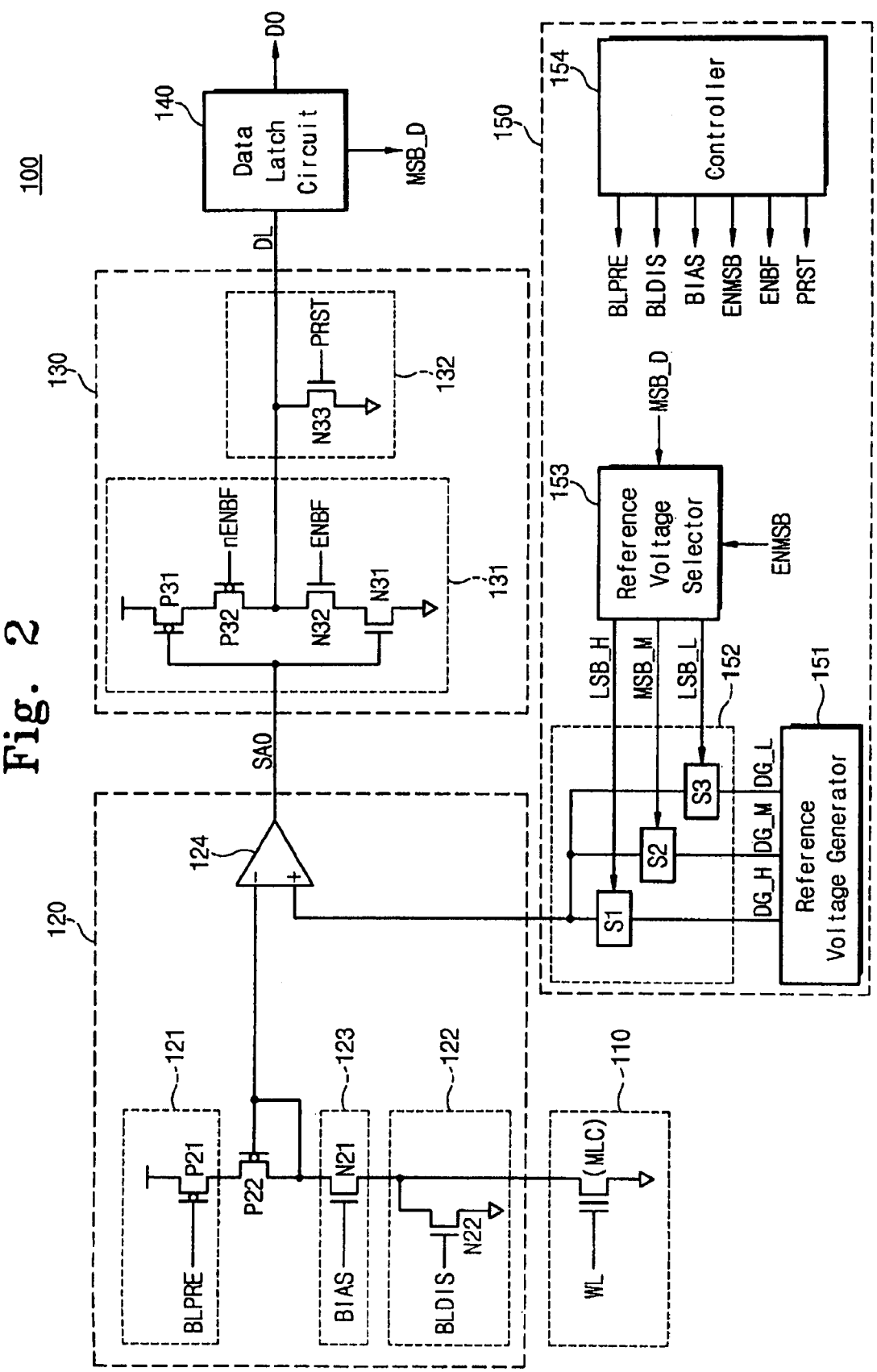
FIG. 2 is a circuit diagram illustrating the NOR flash memory device shown in FIG. 1 in detail.

FIG. 2 is a circuit diagram illustrating an internal structure of the NOR flash memory device shown in FIG. 1 in detail. Referring to FIG. 2, as aforementioned, the NOR flash memory 100 is composed of the multilevel cell (MLC) 110, the sense amplifying circuit 120, the data buffer 130, the data latch circuit 140, and the control logic circuit 150. The control logic circuit 150 is comprised of a reference voltage generator 151, a switching circuit 152, a reference voltage selector 153, and a controller 154.

The multilevel cell 110 is able to store multiple data bits therein. For example, the multilevel cell 110 is capable of storing 2-bit data such as '11', '10', '01' or '00', or 3-bit data such as '111', '110', . . . , '001' or '000', in accordance with a state of threshold voltage thereof.

The sense amplifying circuit 120 detects and amplifies a difference between a reference current and a current flowing through the multilevel cell 110. The sense amplifying circuit 120 is comprised of a bitline precharging circuit 121, a bitline discharging circuit 122, a bitline biasing circuit 123, and an amplifier 124.

The bitline precharging circuit 121 is composed of a PMOS transistor P21, supplying a power source voltage to the sense amplifying circuit 120 in response to a bitline precharging signal BLPRE. The bitline discharging circuit 122 is composed of an NMOS transistor N22, exhausting charge that is accumulated in a corresponding bitline before sensing multiple data bits stored in the multilevel cell 110. The bitline discharging circuit 122 activates a discharging operation in response to a bitline discharging signal BLDIS. During this, an output node of the bitline precharging circuit 121 is set on high level. The bitline biasing circuit 123 is composed of an NMOS transistor N21, being supplied with a DC voltage of a predetermined level (e.g., 1.5V) during a read operation. Between the bitline precharging circuit 121 and the bitline biasing circuit 123, a PMOS transistor P22 is disposed to form a current mirror. The amplifier 124 enlarges a difference between a reference current and a current flowing through the multilevel cell 110, sensing (or detecting) multiple data bits stored in the multilevel cell 110.

The sense amplifying circuit 120 utilizes the single amplifier 124 in detecting multiple data bits stored in the multilevel cell 110. The sense amplifying circuit 110 detects 2-bit data by way of performing two sensing operations using the single amplifier 124, which is referred to as a serial sensing operation. In contrast, an operation that senses 2-bit data at the same time by means of plural amplifiers is referred to as a parallel sensing operation. As mentioned above, a serial sensing operation is able to overcome the problem of amplifier mismatch associated with the parallel sensing operation.

The data buffer 130 sequentially buffers multiple data bits, which are detected by the sense amplifying circuit 120, each bit by each bit. The data buffer 130 includes a tri-state buffer 131 and an initializing circuit 132.

The tri-state buffer 131 is comprised of an inverter that inverts an output value of the sense amplifying circuit 120, and a switch that is turned on or off in response to buffer enabling signals ENBF and nENBF. The inverter is constructed of a PMOS transistor P31 and a NMOS transistor N31. The PMOS transistor P31 is constructed of a source connected to the power source voltage and a gate coupled to the output terminal SAO of the sense amplifying circuit 120. The NMOS transistor N31 is constructed of a source connected to the ground voltage and a gate coupled to the output terminal SAO of the sense amplifying circuit 120. The switch is serially connected between the PMOS and NMOS transistors P31 and N31, being constructed of PMOS and NMOS transistors P32 and N32 turned on or off in response to the buffer enabling signals ENBF and nENBF. Here, the buffer enabling signals ENBF and nENBF are complementary to each other.

The initializing circuit 132 is connected to the output terminal of the data buffer 130, i.e., the data line DL, to which the PMOS and NMOS transistors P32 and N32 are connected in common. The initializing circuit 132 initializes the output terminal DL of the tri-state buffer 131 in response to a reset signal PRST. Referring to FIG. 2, the initializing circuit 132 is composed of an NMOS transistor N33 forming a current channel between the output node of the tri-state buffer 131 and the ground voltage terminal in response to the reset signal PRST.

The data latch circuit 140 is connected to the data buffer by way of the data line DL. The data latch circuit 140 holds an output value of the data buffer 130 for a time period.

Continuing to refer to FIG. 2, the reference voltage generator 151 outputs reference voltages DG_M, DG_L, and DG_H having three different voltages from each other. The first reference voltage DG_M is provided to output a higher data bit, while the second voltage DG_L or the third reference voltage DG_H is provided to output a lower data bit.

The switching circuit 152 is composed of switches S1, S2, and S3 providing one of the first through third reference voltages to appositive (+) terminal of the amplifier 124 in response to selection signals MSB_M, LSB_L, and LSB_H. Here, the switch S1, S2, or S3 may be constructed of a pass transistor, a PMOS transistor, or an NMOS transistor. When the first selection signal MSB_M is input to the switching circuit 152, the sense amplifying circuit 120 detects a higher data bit. Next, if the second or third selection signal LSB_L or LSB_H is applied to the switching circuit 152, the sense amplifying circuit 120 detects a lower data bit.

The reference voltage selection circuit 153 generates the first selection signal MSB_M to operate the sensing operation for a higher data bit in response to a higher-bit enabling signal ENMSB. The first selection signal MSB_M is applied to the second switch S2 of the switching circuit 152. During this, the sense amplifying circuit 120 detects a higher data bit, and the higher data bit detected is held in the data latch circuit 140 after passing through the data buffer 130. Next, the reference voltage selection circuit 153 receives the higher data bit MSB_D from the data latch circuit 140. The reference voltage selection circuit 153 generates the second selection signal LSB_L or the third selection signal LSB_H to be used for sensing a lower bit in response to the higher data bit MSB_D. For example, if the higher data bit MSB_D is '1', the second selection signal LSB_L is generated therefrom. If the higher data bit MSB_D is '0', the third selection signal LSB_H is generated therefrom. The second or third selection signal, LSB_L or LSB_H, is applied to the switching circuit 152. During this, the sense amplifying circuit 120 detects a lower data bit, and the lower data bit detected is held in the data latch circuit 140 after passing through the data buffer 130.

The controller 154 provides control signals BLPRE, BLDIS, BIAS, ENMSB, ENBF, and PRST to the sense amplifying circuit 120, the data buffer 130, the data latch circuit 140, and the reference voltage selection circuit 153 for the serial sensing operation. Timing features of the control signals supplied from the controller 154 are shown in FIGS. 3 and 4 described as follows.

Figure 3:
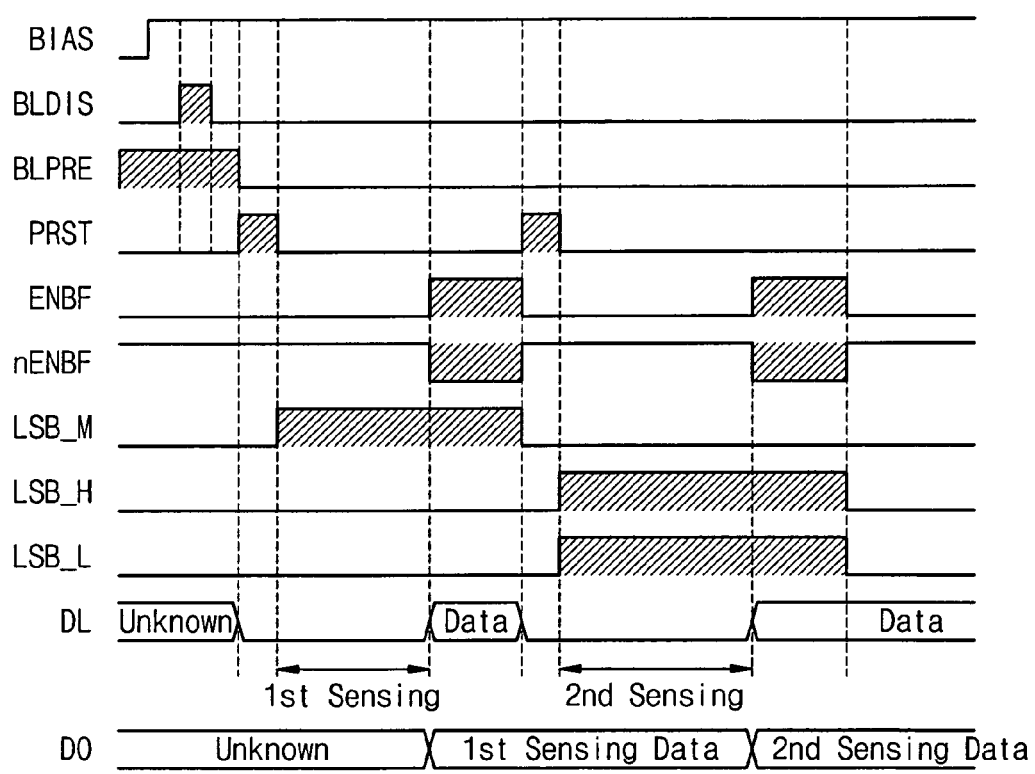
FIG. 3 is a timing diagram illustrating the state of various signals during a serial sensing operation to initialize a data line before a sensing operation in the NOR flash memory device illustrated in FIG. 2.
Figure 4:
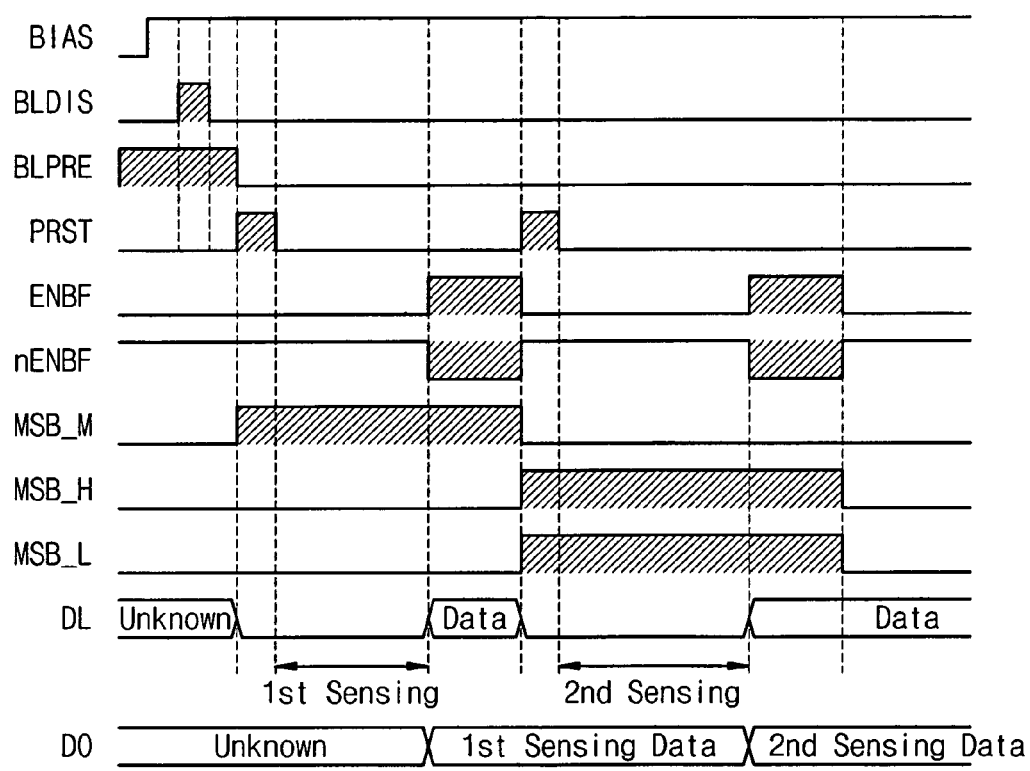
FIG. 4 is a timing diagram illustrating the state of various signals during a serial sensing operation to initialize a data line during a sensing operation in the NOR flash memory device illustrated in FIG. 2.

FIG. 3 is a timing diagram showing the states of various signals during an operation of the NOR flash memory device illustrated in FIG. 2, illustrating the feature of the serial sensing operation to initialize a data line before sensing each of multiple data bits.

First, a bitline biasing signal BIAS is activated. While the bitline biasing signal BIAS is being active, the bitline discharging signal BLDIS is enabled. Subsequently, the bitline precharging signal BLPRE is applied thereto, the output terminal SAO of the sense amplifying circuit 120 is set to high level. During this, an output terminal of the data buffer 130, i.e., the data line DL, is in an unknown, or floating, state. Before sensing the higher data bit, the output terminal of the data buffer 130 is initialized in response to the reset signal PRST provided from the controller 154. The reference selection circuit 153 generates the first selection signal MSB_M to be used in detecting the higher data bit in response to the higher-bit enabling signal ENMSB. The sense amplifying circuit 120 then detects the higher data bit. The data buffer 130 buffers the higher data bit in response to the buffer enabling signals ENBF and nENBF, and the data latch circuit 140 holds the higher data bit buffered to the data line DL.

Next, before sensing the lower data bit, the output terminal of the data buffer 130 is initialized again in response to the reset signal PRST provided from the controller 154. The reference selection circuit 153 generates the second or third selection signal, LSB_L or LSB_H, to be used in detecting the lower data bit in response to the higher data bit MSB_D. The sense amplifying circuit 120 then detects the lower data bit. The data buffer 130 buffers the lower data bit in response to the buffer enabling signals ENBF and nENBF, and the data latch circuit 140 holds the lower data bit buffered to the data line DL.

FIG. 4 is a timing diagram showing the states of various signals during initialization of a data line during a serial sensing operation in the NOR flash memory device.

Referring to FIG. 4, while sensing the higher data bit under activation of the first selection signal MSB_D, the output terminal DL of the data buffer 130 is initialized in response to the reset signal PRST provided from the controller 154. The data buffer 130 buffers the higher data bit in response to the buffer enabling signals ENBF and nENBF, and the data latch circuit 140 holds the higher data bit buffered to the data line DL. Next, while sensing the lower data bit under activation of the second or third selection signal LSB_L or LSB_H, the output terminal of the data buffer 130 is initialized again in response to the reset signal PRST provided from the controller 154. The data buffer 130 buffers the lower data bit in response to the buffer enabling signals ENBF and nENBF, and the data latch circuit 140 holds the lower data bit buffered to the data line DL.

As stated above, the NOR flash memory device in accordance with the present invention initializes the output terminal of the data buffer before or while sensing each of the plural data bits by the sense amplifying circuit. Thus, it is capable of conducting a stabilized serial sensing operation because the data line is conditioned with a uniform level irrespective of the pattern of a data bit previously sensed. In addition thereto, the serial sensing technique according to the present invention is advantageous in assuring a higher sensing margin than the conventional approach and in enhancing sensing speed, and in stabilizing the sensing operation.

While this invention has been particularly shown and described with references to preferred embodiments thereof, it will be understood by those skilled in the art that various changes in form and details may be made herein without departing from the spirit and scope of the invention as defined by the appended claims.

Accordingly, the NOR flash memory device of the present invention initializes the output terminal of the data buffer before sensing, or while sensing, each of the plural data bits by the sense amplifying circuit. Therefore, the present invention is effective in conducting a stabilized serial sensing operation because the data line is conditioned to a uniform charge level irrespective of the pattern of a data bit previously sensed.

What is claimed is:

1. A NOR flash memory device comprising:
   a multilevel cell storing multiple data bits;
   a sense amplifying circuit serially detecting the multiple data bits stored in the multilevel cell;
   a data buffer buffering a data bit detected by the sense amplifying circuit;
   a data latch circuit storing an output value of the data buffer; and
   a control logic circuit regulating the sense amplifying circuit to detect a lower data bit stored in the multilevel cell in response to a higher data bit held in the data latch circuit,
   wherein the control logic circuit initializes an output terminal of the data buffer before detecting each of the multiple data bits by the sense amplifying circuit.

2. The NOR flash memory device as set forth in claim 1, wherein the control logic circuit provides a buffer enabling signal to the data buffer to buffer the data bit detected by the sense amplifying circuit.

3. The NOR flash memory device as set forth in claim 2, wherein the data buffer comprises:
   a tri-state buffer sequentially buffering each of the multiple data bits detected by the sense amplifying circuit, in response to the buffer enabling signal; and an initializing circuit initializing an output node of the tri-state buffer before detecting each of the multiple data bits by the sense amplifying circuit, in response to a reset signal provided by the control logic circuit.

4. The NOR flash memory device as set forth in claim 3, wherein the tri-state buffer is an inverter operating in response to the buffer enabling signal.

5. The NOR flash memory device as set forth in claim 3, wherein the initializing circuit is a MOS transistor forming a current channel between the output node of the tri-state buffer and a ground voltage terminal in response to the reset signal.

* * * * *